(12) United States Patent
Pylant et al.

(10) Patent No.: US 8,286,797 B2
(45) Date of Patent: Oct. 16, 2012

(54) WAFER CONTAINER

(75) Inventors: James D. Pylant, Temecula, CA (US);
Alan L. Waber, Wildomar, CA (US)

(73) Assignee: Texchem Advanced Products Incorporated Sdn. Bhd., Penang (MY)

( * ) Notice: Subject to any disclaimer, the term of this patent is extended or adjusted under 35 U.S.C. 154(b) by 0 days.

(21) Appl. No.: 13/436,812

(22) Filed: Mar. 30, 2012

(65) Prior Publication Data

US 2012/0187024 A1 Jul. 26, 2012

Related U.S. Application Data

(63) Continuation of application No. 13/367,365, filed on Feb. 6, 2012, which is a continuation of application No. 12/548,368, filed on Aug. 26, 2009, now Pat. No. 8,109,390.

(51) Int. Cl.
*B65D 85/30* (2006.01)
(52) U.S. Cl. .................. 206/710; 206/303; 206/454
(58) Field of Classification Search .......... 206/710–712, 206/454, 449, 303, 1.5, 722, 308.1, 307.1; 220/326, 4.21, 4.24; 438/460, 464; 211/41.18
See application file for complete search history.

(56) References Cited

U.S. PATENT DOCUMENTS

| | | | |
|---|---|---|---|
| 4,333,580 A | 6/1982 | Sweigart, Jr. | |
| 5,452,795 A | 9/1995 | Gallagher et al. | |
| 6,010,008 A | 1/2000 | Nyseth et al. | |
| 6,039,186 A | 3/2000 | Bhatt et al. | |
| 6,193,068 B1 | 2/2001 | Lewis et al. | |
| 6,286,684 B1 * | 9/2001 | Brooks et al. | 206/710 |
| 6,341,695 B1 | 1/2002 | Lewis et al. | |
| 6,398,022 B1 | 6/2002 | Mou et al. | |
| 6,533,123 B1 | 3/2003 | Nakamura et al. | |
| 6,550,619 B2 | 4/2003 | Bores et al. | |
| 6,564,946 B2 | 5/2003 | Lewis et al. | |
| 6,626,289 B2 | 9/2003 | Nagata et al. | |
| 6,662,950 B1 | 12/2003 | Cleaver | |
| 6,988,620 B2 | 1/2006 | Haggard et al. | |
| 6,988,621 B2 | 1/2006 | Forsyth | |
| 7,040,487 B2 | 5/2006 | Zabka et al. | |
| 7,059,475 B2 | 6/2006 | Zabka et al. | |
| 7,131,248 B2 | 11/2006 | Pylant et al. | |
| 7,431,162 B2 | 10/2008 | Forsyth | |

(Continued)

FOREIGN PATENT DOCUMENTS

| | | |
|---|---|---|
| KR | 2005-113889 | 12/2005 |
| KR | 0414886 | 4/2006 |
| WO | WO 9700820 | 1/1997 |

(Continued)

*Primary Examiner* — J. Gregory Pickett
*Assistant Examiner* — Ernesto Grano
(74) *Attorney, Agent, or Firm* — Sam K. Tahmassebi; TechLaw LLP

(57) ABSTRACT

Improvements in a semiconductor wafer container including improvements in side protection to the wafers, improved cover design to minimize rotation, a simplified top cover orientation mechanism and an improved bottom holding mechanism for automation. The side protection to the wafers is with multiple staggered inner and outer walls. The improved cover design improves alignment of the top and bottom housings and minimizes rotation of the housings in transit or motion. The housings have a recessed tab ramp feature with bi-directional locking that also increases the rigidity of the containment device when the two housings are assembled. The improved bottom holding mechanism for automation is an integrated feature that is molded into the bottom housing and not assembled in a secondary operation. The molded integration reduces tolerance errors that are present in assembling multiple pieces and joining multiple pieces.

9 Claims, 8 Drawing Sheets

U.S. PATENT DOCUMENTS

| | | |
|---|---|---|
| 7,918,341 B2 | 4/2011 | Pylant et al. |
| 2003/0000856 A1 | 1/2003 | Lax et al. |
| 2005/0269241 A1 | 12/2005 | Brooks et al. |
| 2006/0180499 A1 | 8/2006 | Forsyth et al. |
| 2009/0095650 A1 | 4/2009 | Pylant et al. |
| 2011/0036748 A1 | 2/2011 | Pylant et al. |

FOREIGN PATENT DOCUMENTS

| | | |
|---|---|---|
| WO | WO 9958412 | 11/1999 |
| WO | WO 2004087535 | 10/2004 |
| WO | WO 2005019065 | 3/2005 |
| WO | WO 2005044695 | 5/2005 |
| WO | WO 2006125859 | 11/2006 |

* cited by examiner

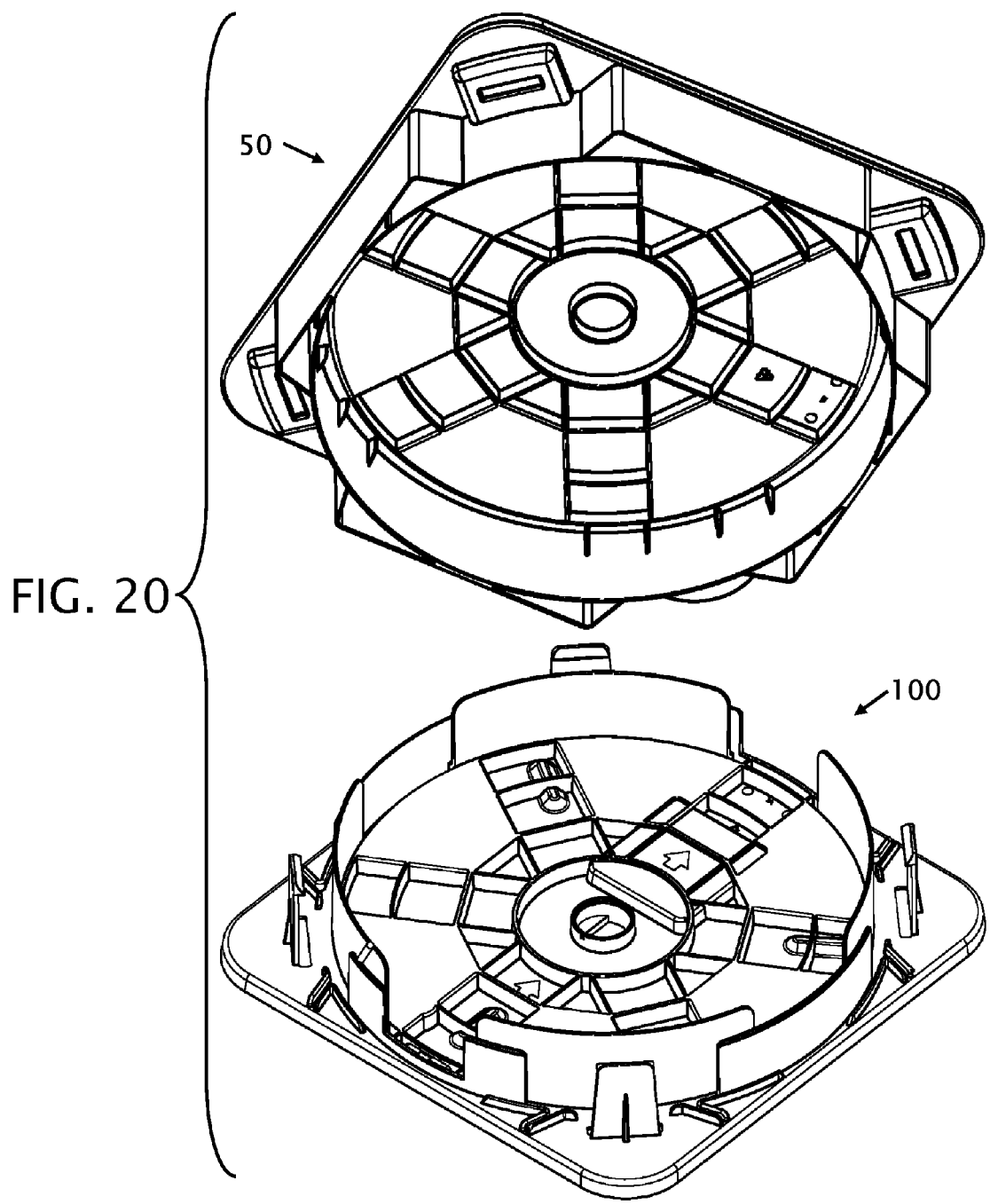

WAFER CONTAINER

RELATED APPLICATION

This application is a continuation of U.S. application Ser. No. 13/367,365, filed Feb. 6, 2012, by James Pylant and Alan Waber, and entitled "WAFER CONTAINER," which in turn claims priority to U.S. application Ser. No. 12/548,368, filed Aug. 26, 2009, by James Pylant and Alan Waber, and entitled "WAFER CONTAINER WITH OVERLAPPING WALL STRUCTURE," now U.S. Pat. No. 8,109,390, issued on Feb. 7, 2012, both of which are incorporated herein by reference in their entirety, including the drawings.

FIELD OF THE INVENTION

This invention relates to improvements in a container for the transportation of semiconductor wafers. More particularly, the present wafer container includes improvements in side protection to the wafers, improved cover design to minimize rotation, a simplified top cover orientation mechanism and an improved bottom holding mechanism for automation.

BACKGROUND OF THE INVENTION

In the processing of semiconductor wafers the typically must be transported either between processes or to other facilities. The semiconductor wafers are fragile and damage to the surface of the wafers can make the wafer useless for the intended purpose. Because of the high potential for damage to the wafer the semiconductors must be packaged and transported to minimize harm. In transportation, multiple semiconductor wafers are stacked into a transportation container. There have been a number of containment products and patents have been sold and patented to try and minimize damage to these silicon wafers. Exemplary examples of patents covering these products are disclosed herein.

U.S. Pat. No. 6,193,068 issued Feb. 27, 2001 to Lee Lewis et al., and U.S. Pat. No. 6,341,695 issued Jan. 29, 2002 to Lee Lewis et al., disclose a containment device for retaining semiconductor wafers. This patent discloses two concentric walls on the top and bottom housings that nest to protect the semiconductor wafers. Double walls were designed to protect the wafers from the direct transmission of forces that may contact the outer wall. While the nesting walls provide protection from side impacts they do not provide flexibility to absorb and cushion a side impact or drop. The combination of an outer wall and a gap provide the protection. Damage may also occur if the force is such that the outer wall flexes enough to interfere with the inner wall, thereby damaging the wafers. That can cause the semiconductor wafers to shift and scratch.

U.S. Patent Publication Number U.S.2009/0095650 that was published on Apr. 16, 2009 to James D. Pylant et al., discloses a wafer container with staggered wall structure. In this published application the design is limited by the amount overlap of the inner and outer walls by the design of its staggered walls. The walls were limited to 5% overlap, with 95 percent of the outer wall not located in adjoining angular sectors. This and other top cover rotation locating mechanisms use either an inner surface of a feature on the top cover or an exterior surface of a feature on the top cover to secure the top cover in place and prevent rotation.

U.S. Pat. No. 6,550,619 issued Apr. 22, 2003 to Gregory W. Bores et al., discloses a shock resistant variable load tolerant wafer shipper. This patent uses four inner tapers walls with a variable amount of cushions placed between the semiconductor wafers to pack and cushion the semiconductor wafer. While this patent allows for a variable amount of semiconductor wafers to be packed within the shipper the cushioning relies on the variable amount of cushions placed between the semiconductor wafers to reduce damage.

U.S. Pat. No. 7,040,487 issued on May 9, 2006 to Michael Zabka et al., discloses a protective shipper with a corrugates inner containment lip. The corrugated inner lip provides multiple surfaces for the edges if the semiconductor wafers to make contact with, but because the edges are corrugated the tangential walls of the corrugation limit the flexing of the inner lips.

Some semiconductor wafer containers use a rotation locking design where the locating mechanism with an exclusive inner surface or exterior surface do not securely capture the wall that they are adjacent to in both directions of rotation. These features only stop rotation in only one direction. The features must rely on a sister feature to stop rotation in the opposite direction which is generally located farther away and allows for more manufacturing tolerance to build up since it is located at a greater distance. These deficiencies result in larger gaps between the plus and minus rotational limiting surfaces, thereby leading to more rotational movement.

There are a number of prior designs that use top cover orientation features with differing wall engagement angles or large latches as opposed to small slots. The new feature in this proposed wafer container allows improved orientation that is not found in the prior art.

There are a number of different holding and clamping features in wafer shipping containers. All of these prior designs rely on multiple parts to create a clamping lip. These designs have several drawbacks including but not limited to the parts not being rigid with respect to the bottom assembly because they must be sonic welded, bonded or snapped together and that secondary parts or assembly operations are more expensive to produce.

The engagement of latches that secure the top and bottom housings together have a number of limitations. Specifically, prior art latches provide a raised straight slope ramp. The raise straight sloped surface is susceptible to damage and also, the straight slope does not provide an ideal self gripping to engage between the top and bottom housings. The top cover orientation features use differing wall engagement angles or large latches as opposed to small slots as presented in this pending application.

What is needed is a semiconductor wafer container with improvements in side protection to the wafers, improved cover design to minimize rotation, a simplified top cover orientation mechanism and an improved bottom holding mechanism for automation. This pending application satisfies these requirements with novel improvements in the identified areas.

BRIEF SUMMARY OF THE INVENTION

It is an object of the semiconductor wafer container that has an overlapping double wall. The wall structure comprises multiple outer walls and multiple inner walls. The overlapping double containment wall increases semiconductor wafer protection during impact or shipping. Each inner wall shares a minimal percentage of a common angular sector with each adjacent outer wall. The inner wall is generally very stiff and does not absorb and cushion the wafers if the container is dropped or subject to impact. On the bottom assembly, the inner walls and outer walls are positioned in an offset and overlapping configuration provides maximum protection to the semiconductor wafers.

It is an object of the semiconductor wafer container to improve alignment of the top cover with the base. The alignment system includes reference tabs that are received by the cover and a visual identifier for guiding an operator in the proper alignment of the two halves of the container. The top cover orientation features prevent improper installation of the top cover to the bottom member. The top cover orientation feature is incorporated into the top cover that mates with the features of the double locking location feature. This orientation feature prevents installation of the top cover in plus or minus 90 degree locations about the central axis.

It is an object of the semiconductor wafer container to provide an improved locking mechanism for securing two halves of a wafer container together. The bottom half comprises a wall structure perpendicular to the base. The wall structure comprises segmented inner and outer walls, where each portion of the wall structure has a distinctive arc length. The arc length of each inner wall does not completely overlap with the arc length of any outer wall.

It is an object of the semiconductor wafer container to provide an improved engagement feature for the locking tabs. These improved tabs include a cover for a wafer container that engages to a base. The cover includes one or more notches, each having a ramp that easily receive latches from the base.

It is another object of the semiconductor wafer container to incorporate bi-directional rotation locking feature(s). These features improve orienting, the top member on the bottom member that decreases the amount of top cover rotation and movement with respect to the bottom member. This feature creates a double locking location that securely locates and locks the top cover in place during top cover assembly. The bi-directional rotation locking feature is located on both sides of the perpendicular top cover surfaces of a single wall on both the interior and the exterior simultaneously. This improvement provides bi-directional locking of the captured surface decreases the amount of top cover rotation and movement with respect to the bottom member and increases the rigidity of the containment device when the members are assembled.

It is still another object of the semiconductor wafer container to include an improved holding and clamping feature to allow for automated machinery to latch onto and hold the bottom member and secure it firmly to the machinery nesting locations. This mechanism is comprised of a single piece feature that is molded into the bottom member. The holding and clamping feature on the bottom member improves equipment interface where these containers are used. The feature is a holding mechanism to allow for automated machinery to latch onto and hold the bottom member and secure it firmly to the machinery nesting locations.

It is still another object of the semiconductor wafer container to include an improved curved latch recess for improved closure and retention of the containment device latches. In the improved latch and latch recess the height of the latch is equal to or lower than the inner wall structure. This allows equipment to interface with the bottom member of the container without interference with the equipment and latch height. A curvature on the mating surface provides superior holding and self centering and gripping during handling and after impact. This recessed feature also protects the mating surface from damage when the top cover is disassembled from the bottom member. The latch recess and curved surface also provides increased latch retention and container integrity during impact or shipping. This includes a lowered latch equal to or less than the inner wall height.

Various objects, features, aspects, and advantages of the present invention will become more apparent from the following detailed description of preferred embodiments of the invention, along with the accompanying drawings in which like numerals represent like components.

BRIEF DESCRIPTION OF THE SEVERAL VIEWS OF THE DRAWING(S)

FIG. 20 shows a perspective view of the top and bottom housings in an open exploded view for reference of the internal components.

DETAILED DESCRIPTION OF THE INVENTION

Figure 1:
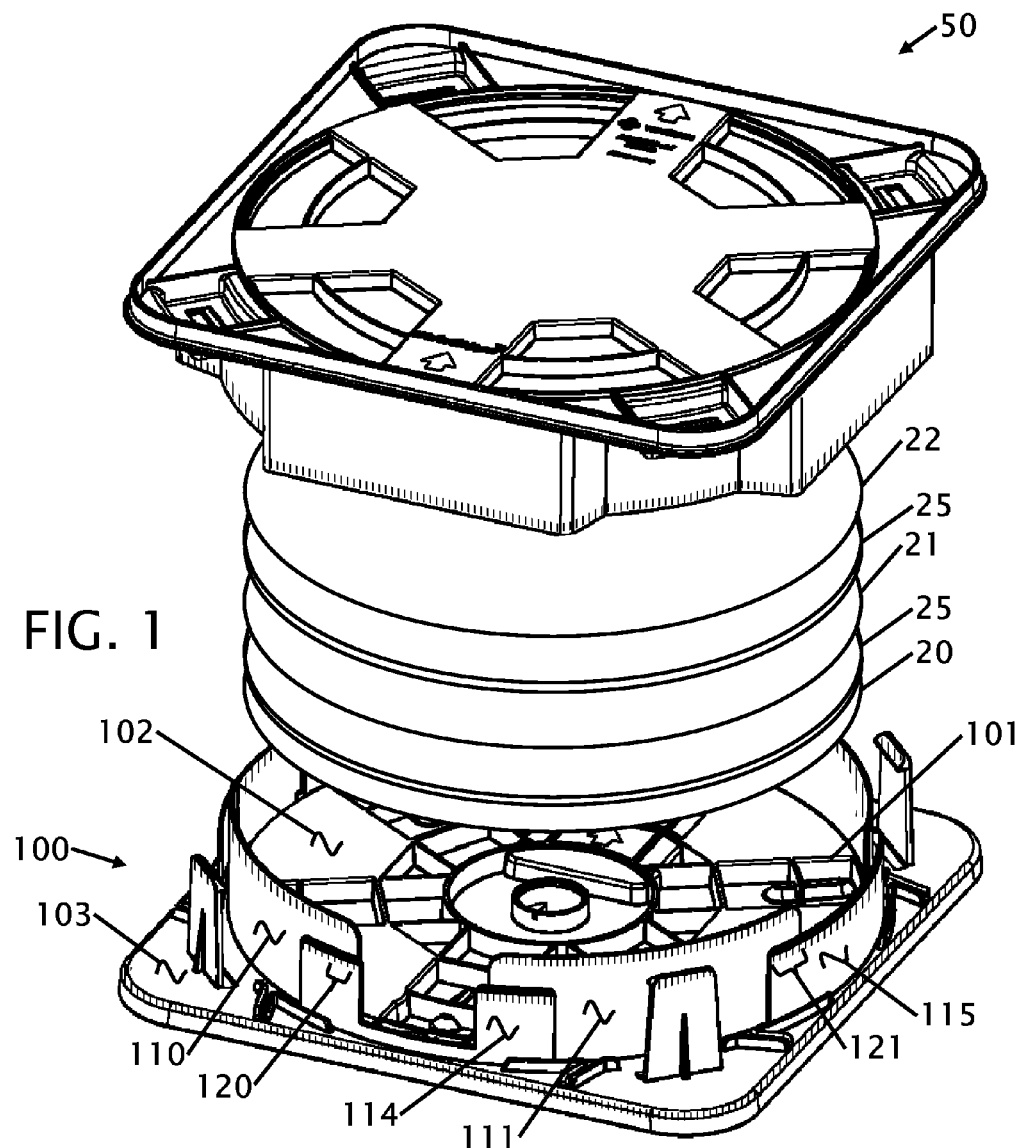
FIG. 1 shows a perspective exploded view of the wafer container with a plurality of wafers disposed between the two wafer container halves.

FIG. 1 shows a perspective exploded view of the wafer container with a plurality of wafers disposed between the two wafer container clam shells. A plurality of semiconductor wafers 20, 21 and 22 are shown between the top 50 and bottom 100 housing with wafer separators 25. The inside base surface 102 extends to the outside of the base surface 103 where the bottom housing has a ribbed pattern 101 that supports the bottom of the bottom most semiconductor wafer 20 and provides increased structural strength to the fairly plainer base surface 102 and 103. Both the top 50 and the bottom housings 100 have essentially planar rectangular or square bases. A plurality of inner rib walls 110 and 111 of the bottom housing 100 protect the semiconductor wafers from shifting side damage. These walls can flex to cushion side impact. They are formed in a segmented pattern in the bottom housing. The segmented ribs are shown and described in more detail with FIG. 2. A second set of segmented outer ribs 112 and 113 exist outside of the inner rib walls 110 and 111. The rib walls exist in an overlapped 120 and 121 pattern to prevent debris from passing directly through the segmented ribs.

Figure 2:
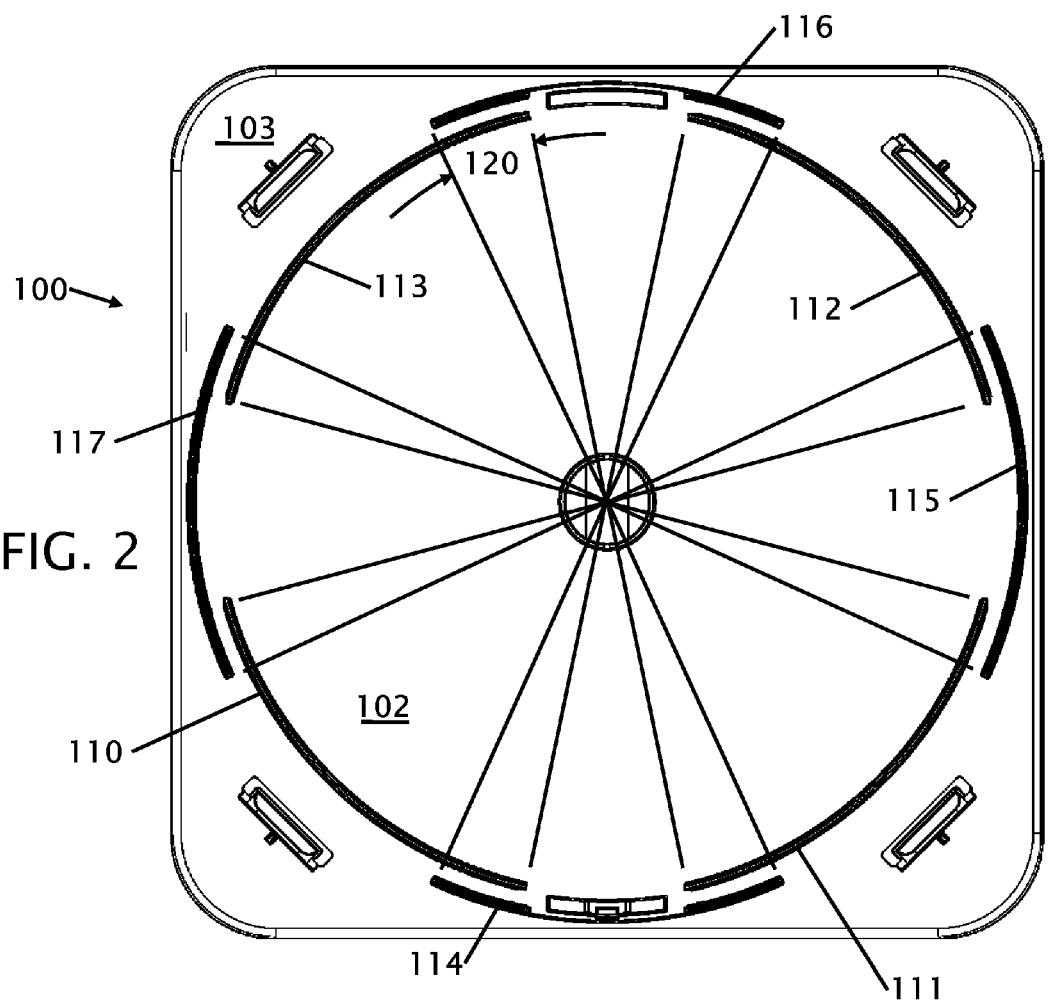
FIG. 2 shows a top view of the bottom housing with the overlapping rib wall pattern.
Figure 3:
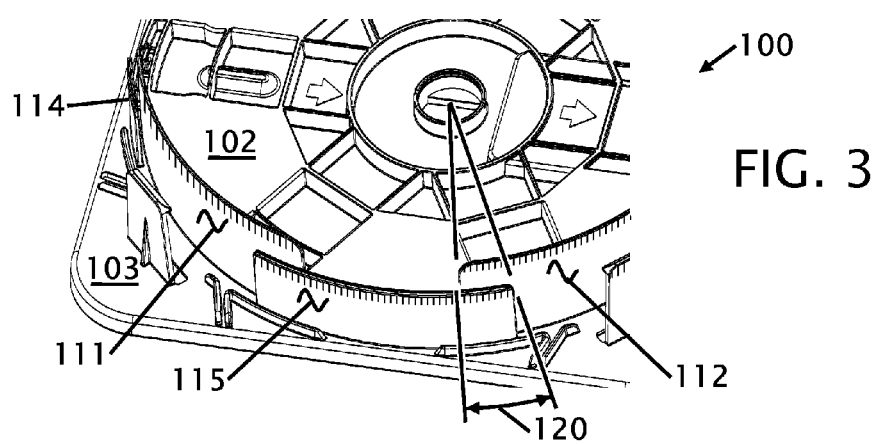
FIG. 3 shows a detailed perspective view of the overlapping inner rib walls.

FIG. 2 shows a top view of the bottom housing with the overlapping rib wall pattern. Note that some features, such as bottom ribs, have been deleted from the bottom surface 102 and 103 and the overlapping ribs have been moved slightly to improve clarity of the overlapping rib features being discussed herein. FIG. 3 shows a detailed perspective view of the overlapping inner rib walls. While in FIGS. 2 and 3 only one section of overlapping ribs is identified, the overlapping condition exists in eight places in the bottom housing 100. While the preferred embodiment shows four inner rib walls 110-113 and four outer rib walls 114-117 it is contemplated that a greater or lesser number of overlapping can be used. In FIGS. 2 and 3 the overlap 120 is labeled, and in the preferred embodiment the overlap angle is between 5 and 15 degrees, but prototypes have been made using an overlap angle 120 of 7.5 degrees. The ribs 110-117 are arc segments that extend perpendicular from the essentially planar base 102 and 103. These angles are variable based upon the height of the rib, the material, the thickness of the rib, the desired cushion and the distance between the inner and outer ribs. In general the distance between the inner and outer ribs is controlled based upon the annular rib in the top clam shell housing.

The overlapping double wall provides maximum protection from shock or impact to the exterior of the containment device by positioning the inner and outer wall in an offset and overlapping configuration as to increase the protection of the semiconductor wafers from direct transmission forces by increasing the amount of flex movement allowed by the outer wall. Increasing the flex tolerance of the outer wall increases the overall shock absorbing ability of the containment device. This design also allows for a greater percentage of "wrap" around the semiconductor wafer and therefore minimize lateral shift into the gaps between inner wall segments. Segmenting the inner wall makes it more flexible and thus able to absorb and cushion the wafers if the container is dropped or subject to impact.

As shown in FIGS. 1 and 3. The outer rib walls 114-117 need not be the same height as the inner rib 110-113 walls. In some cases, the lowered exterior wall allows for greater top cover deflection during impact before it touches the inner wall. The image in the figures shows the exterior rib walls 114-117 at approximately ⅔rds the height of the inner rib walls 110-113 as shown in FIG. 1.

Figure 4:
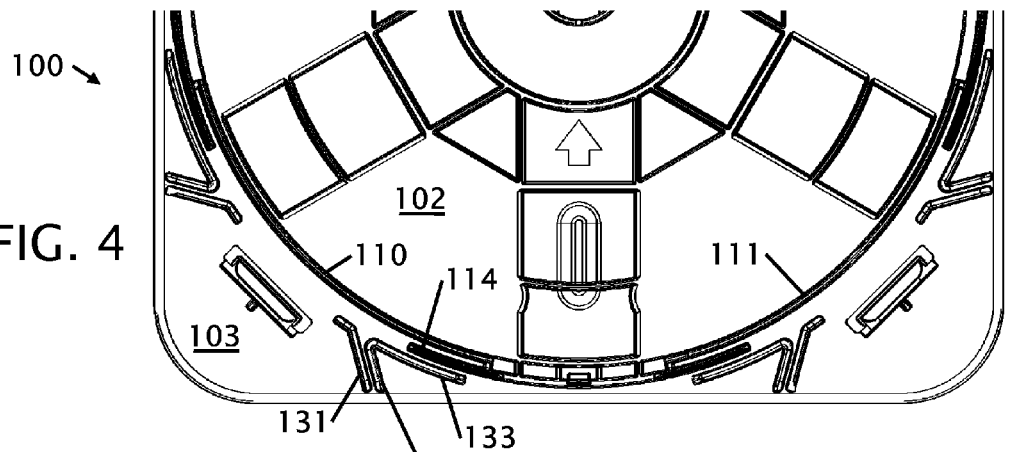
FIG. 4 shows a top view of the bi-directional locking feature in the bottom housing.
Figure 5:
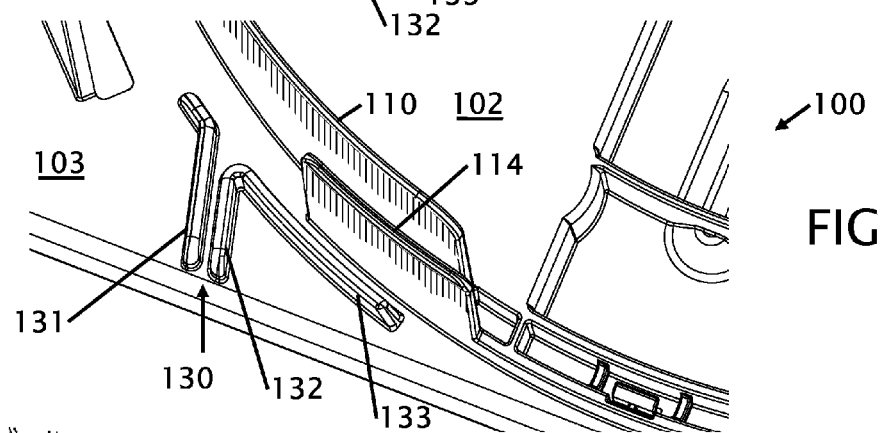
FIG. 5 shows a perspective view of the bi-directional locking feature on the bottom housing.
Figure 6:
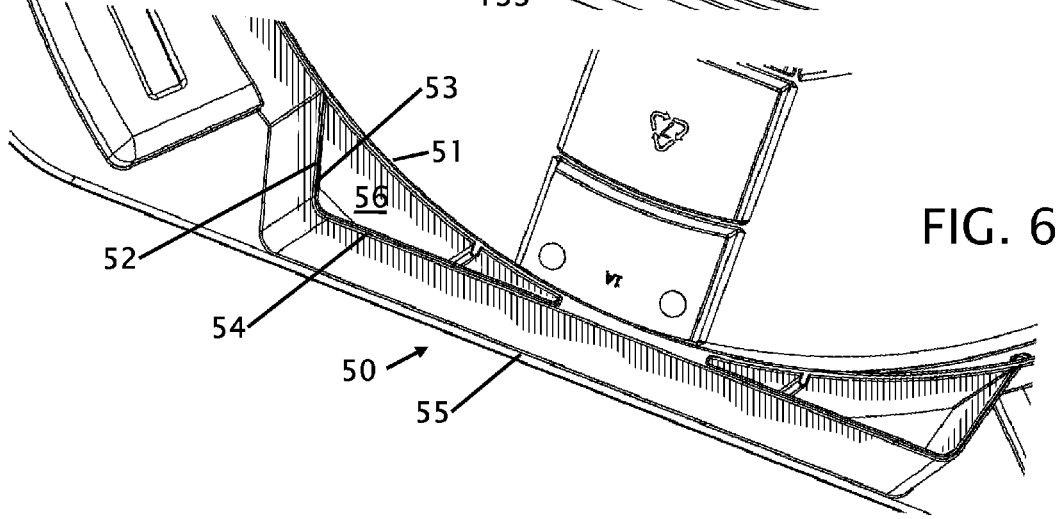
FIG. 6 shows a perspective view of the bi-directional locking feature on the top housing.

FIG. 4 shows a top view of the bi-directional locking feature in the bottom housing 100. FIG. 5 shows a perspective view of the bi-directional locking feature on the bottom housing 100. FIG. 6 shows a perspective view of the bi-directional locking feature on the top housing 50. Starting with FIG. 6 the circular rib 51 is shown extending from the planar base of the top housing 50. A "U" shaped rib extends from the circular rib 51 to the outer edge 55 of the top housing 50 and around to join back with the circular rib 51. This "U" shaped rib can exist in a variety of shapes to provide a key to ensure that it locks into only one of four possible orientations with the bottom housing 100. This "U" shaped rib that extends to the outer edge 55 has an inside face 53 and an outside face 52. Where the "U" shaped rib joins with the outer edge 55 there is an outside protection and support rib 54.

A pair of securing ribs consisting of an outer locking rib 131 and an inner locking rib 132 on the bottom housing 100 are configured to engage onto the opposing sides of the inside face 53 and an outside face 52 of the "U" shaped rib when the "U" shaped rib is engaged into the locking cavity 130. Circular lock rib 133 is configured to fit within cavity 56 on the top housing 50 along with the inner lock rib 132. When the rib defined by items 52/53 is engaged into the locking cavity 130 these features improve orienting, the top housing 50 on the bottom housing 100 that decreases the amount of top cover 50 rotation and movement with respect to the bottom member 100. This feature creates a double locking location that securely locates and locks the top cover 50 in place during top cover assembly. The bi-directional rotation locking further increases the rigidity of the containment device when the members are assembled. The "U" shaped and is shown in an approximate orthogonal relationship to three sides of the bottom housing 100. While only one location of the bi-directional lock is shown and described in detail, the feature exists on all four sides of the top and bottom housings.

Figure 7:
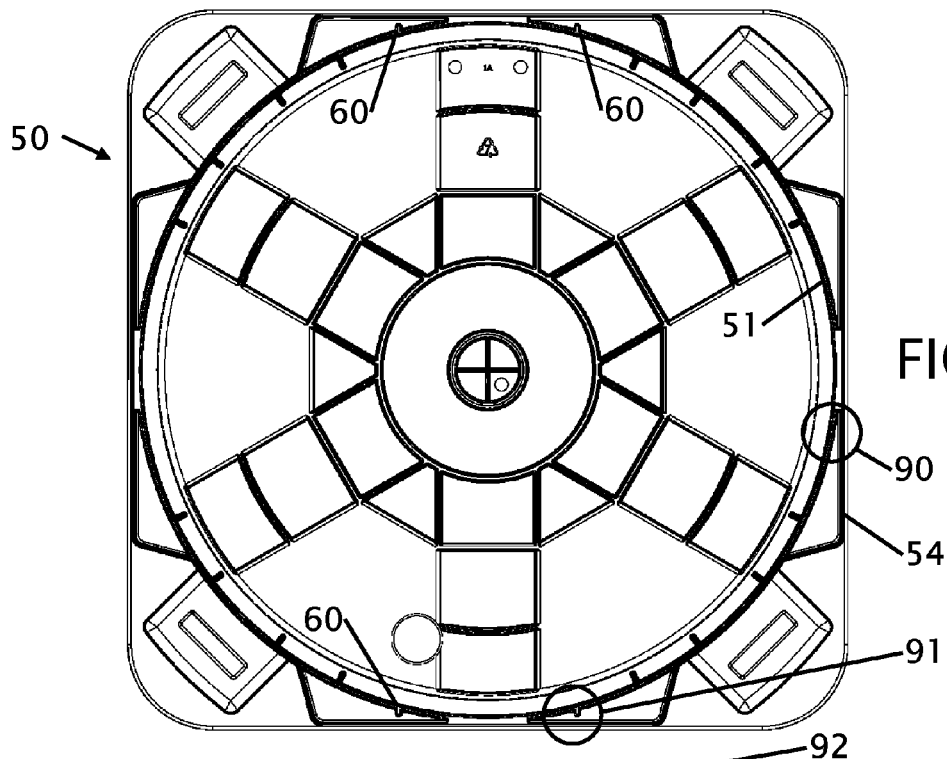
FIG. 7 shows an inside plan view of the top housing showing the orientation features.
Figure 8:
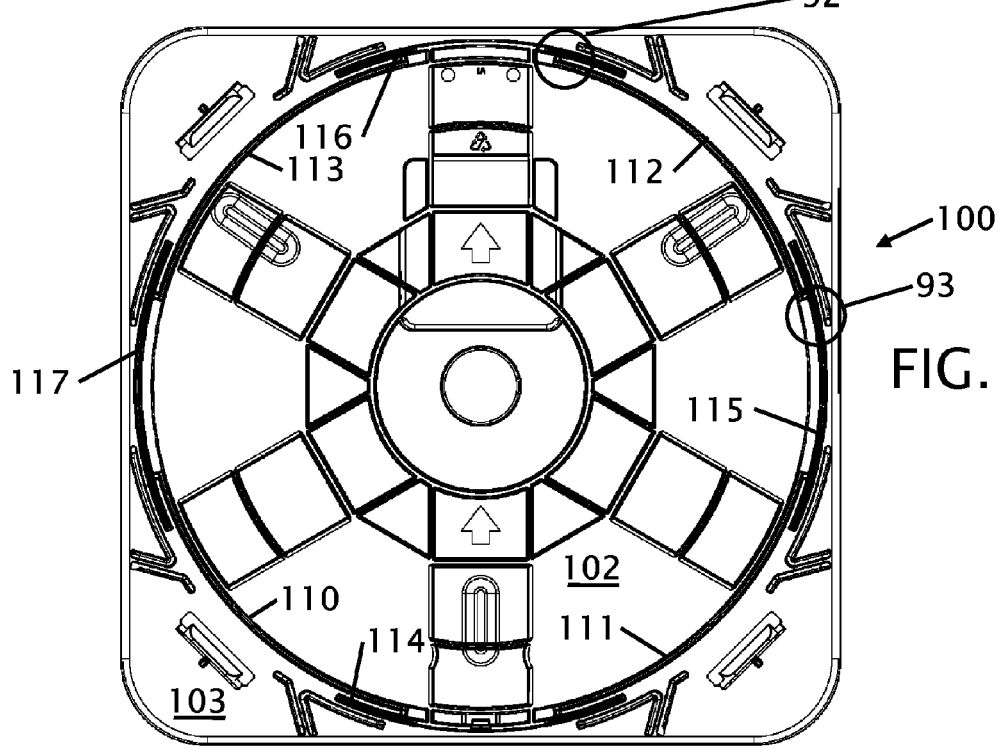
FIG. 8 shows inside plan view of the bottom housing showing the orientation features.
Figure 9:
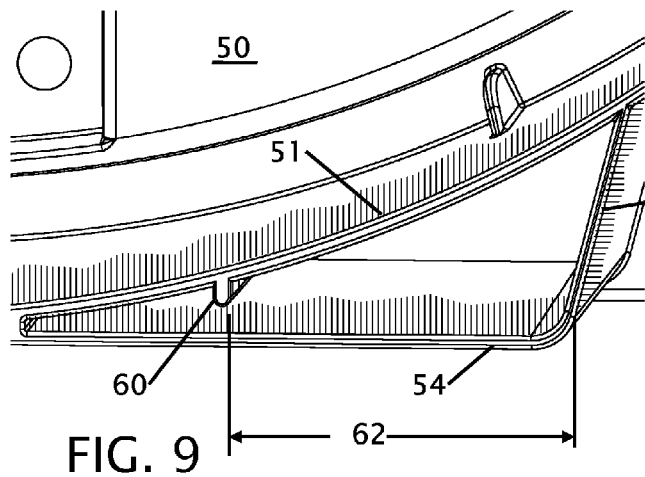
FIG. 9 shows a detail perspective view of the orientation key in the top housing.
Figure 10:
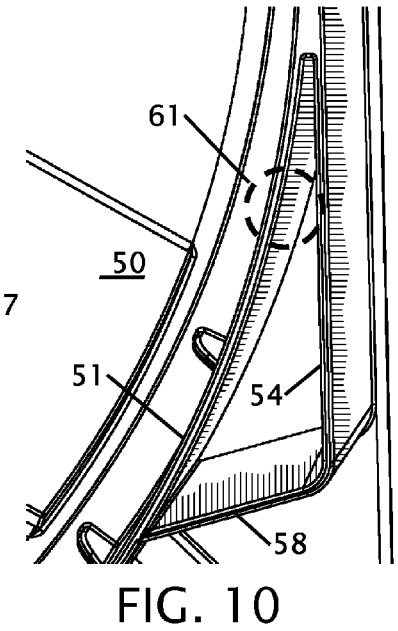
FIG. 10 shows a detail perspective view without the orientation key in the top housing
Figure 11:
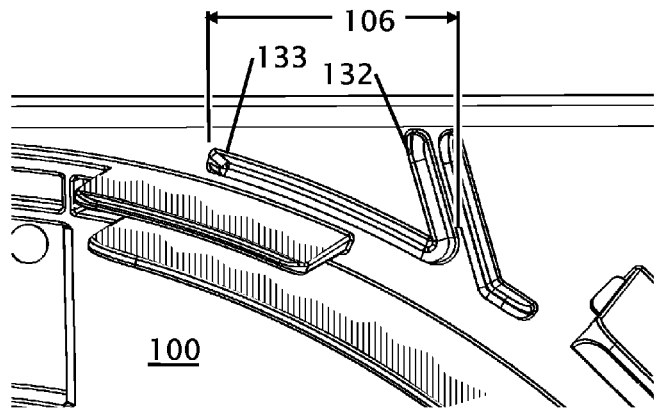
FIG. 11 shows a detail perspective view of the clearance for the orientation key in the bottom housing.
Figure 12:
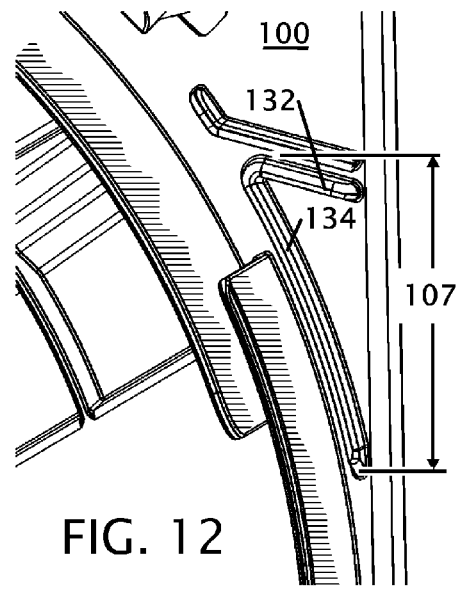
FIG. 12 shows a detail perspective view of the interference for the orientation key in the bottom housing.

FIG. 7 shows an inside plan view of the top housing showing the orientation features and FIG. 8 shows inside plan view of the bottom housing showing the orientation features. FIG. 9 shows a detail perspective view of the orientation key in the top housing. FIG. 10 shows a detail perspective view without the orientation key in the top housing. FIG. 11 shows a detail perspective view of the clearance for the orientation key in the bottom housing. FIG. 12 shows a detail perspective view of the interference for the orientation key in the bottom housing. For perspective, the area's 90, 91, 92 and 93 are shown enlarged and in perspective in FIGS. 9, 10, 11 and 12 to show the orientation tab 60 and how in allows or blocks seating of the top and bottom housings 50 and 100.

In FIG. 9 the orientation rib 60 is shown extending essentially normal from the circular rib 51 at a particular distance 62 from the corner of the "U" shaped rib 54 and 57. In FIG. 10 the orientation rib is not present in area 61 in the corner of the "U" shaped rib 54 and 58. Now refer to FIGS. 11 and 12 to see where the orientation rib 60 would be blocked or bypassed by the details. In FIG. 11 the dimension 106 between the corner radius of curved lock rib 133 and the inner lock rib 132 is shorter than the distance 107 between the curved lock rib 134 and the inner lock rib 132 in FIG. 12. Upon placement of the top housing onto the bottom in an out of proper orientation arrangement the longer circular block rib 134 would interfere with the orientation rib 60. In the correct orientation the shorter circular lock rib 133 would clear the orientation tab 60.

From FIG. 7, a total of four orientation tabs are shown to allow the housings to sit flat on the orientation tabs when the housings are not properly aligned. The orientation tabs 60 prevent improper assembly of said top housing and said bottom housing members from being installed 90 degrees out of alignment.

Figure 13:
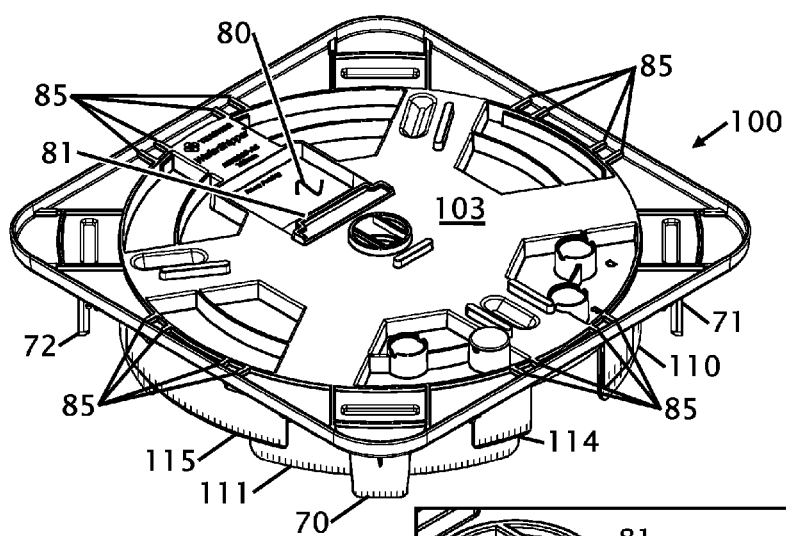
FIG. 13 shows a top perspective view of the bottom housing.
Figure 14:
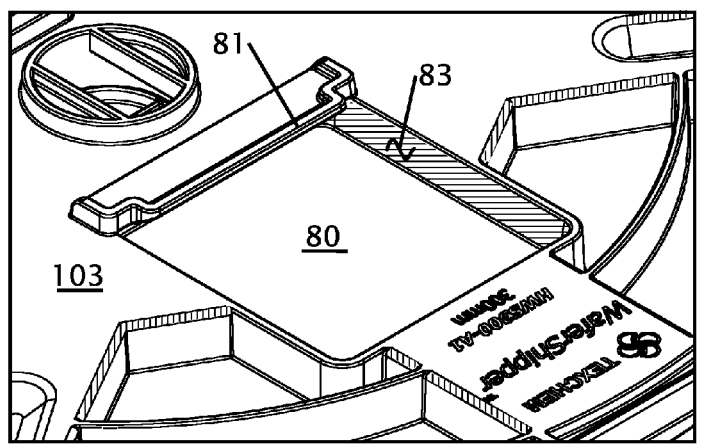
FIG. 14 shows a detailed perspective view of the hold down latch.
Figure 15:
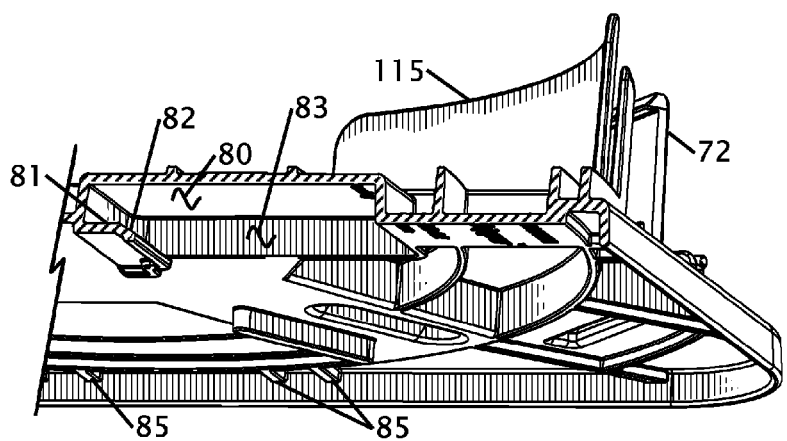
FIG. 15 shows a perspective cross section of the hold down latch.

FIG. 13 shows a top perspective view of the bottom housing. FIG. 14 shows a detailed perspective view of the hold down latch. FIG. 15 shows a perspective cross section of the hold down latch. In views 13 and 15 some parts of the circular ribs 110, 111, 114 and 115 are visible to help to provide a visual orientation for the pocket 80 and latch features. The bottom housing 100 has an undercut hold down recessed pocket 80 with a latch surface tab 81 for a retention mechanism to hold the housing in automated assembly. The latch surface is formed in a molding process with the molding of said bottom housing 100. The latch surface 81 is located at a height that is equal to or lower than the planar bottom surface 103 of said bottom housing 100. The latch surface 81 further has an angled or curved entry surface 82. The pocket further has at least two essentially vertical side walls 83 to self center said bottom housing on said retention mechanism.

The height of the latch is equal to or lower than the inner wall structure to allow equipment to interface with the bottom member of the container without interference with the equipment and recess pocket 80 and the latch surface 81. This recessed feature also protects the mating surface from damage when the top cover is disassembled from the bottom member. In FIGS. 13 and 15 housing latches 70, 71 and 72 are shown. These latches secured the top and bottom housings together.

In FIGS. 13 and 15 a plurality of bearing ribs 85 are shown. These ribs are configured to distribute the load from a bottom housing stacked on top of the top housing. Looking briefly at FIG. 18, it can be seen that the annular lip 87 of the bottom housing 100 is placed at a different dimension from the annular lip 86 of the top housing 50. This allows the housings to stack or nest. When stacking multiple wafer containers together the weight of the container when filled with wafers is significant. Some wafer containers are enclosed in a protective plastic bag, and when the stacked bearing surface is small this creates a high bearing load which damages or punctures the protective bag. Calculation and testing has identified that multiple bearing surfaces 85 of greater than 2.25 mm$^2$ each with more than 4 bearing ribs 85 per quadrant will adequately protect the containers from damage and will also prevent the protective plastic bags from being punctured or damaged.

Figure 16:
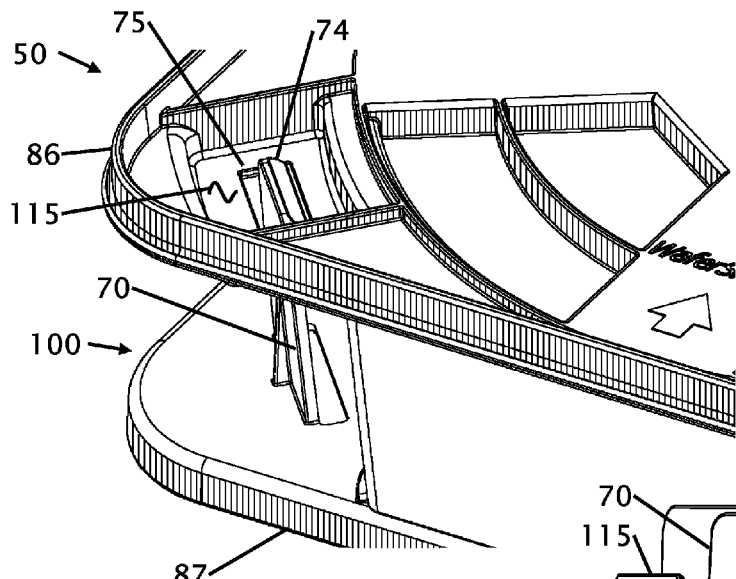
FIG. 16 shows a perspective view of the top and bottom latch tab engaged.
Figure 17:
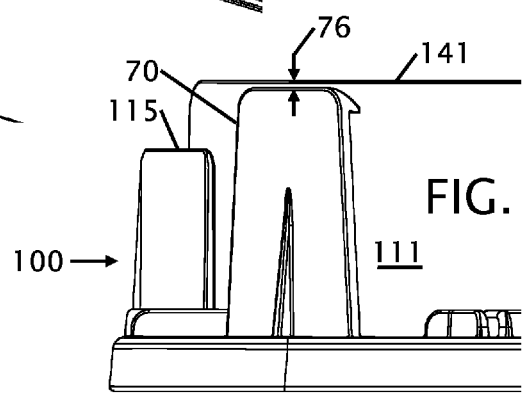
FIG. 17 shows a side view of the bottom latch tab.
Figure 18:
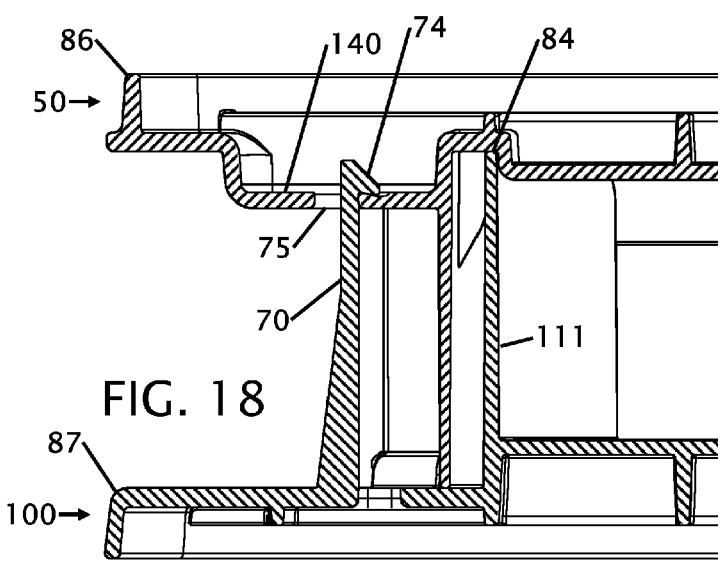
FIG. 18 shows a sectional view of the latch engaged between the top and bottom housings.
Figure 19:
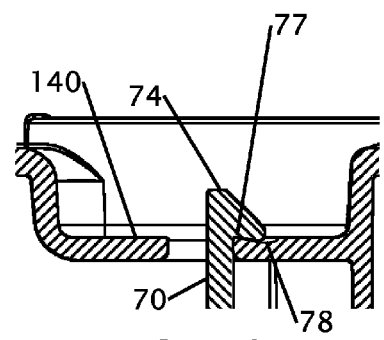
FIG. 19 shows a detailed view of the engaged between the top and bottom housings.

FIG. 16 shows a perspective view of the top and bottom latch tab engaged. FIG. 17 shows a side view of the bottom latch tab. FIG. 18 shows a sectional view of the latch engaged between the top and bottom housings. FIG. 19 shows a detailed view of the engaged between the top and bottom housings. The bottom housing 100 has at least one latch that engages in a corresponding notch 75 located on the top housing 50.

The top surface 74 of said latch 70 is located at a height 76 that is below the top surface of said at least one rib 141. The height 76 of the latch 70 is equal to or lower than the inner wall 141 structure. This allows equipment to interface with the bottom member of the container without interference with the equipment and latch height. This further reduces the possibility of damage to the latch 70 if the bottom housing 100 is dragged on a surface. In the preferred embodiment there are four latches 70 and four corresponding notches 75 located in each corner region of said top housing 50 or said bottom 100 housing, but as few as one or two are contemplate as well as four or more latches. FIG. 19 shows that the notch 70 has a curve entry ramp 77 and a recess 78 that elevates the latch 70 above said entry ramp 77 and lowers said latch 70 into the recess 78 to retain the latch 70 in the recess 78. When the latch(s) are secured the top of the inner rib wall 111 is tightly engaged and captured on the corresponding surface 84 of the top housing 50. The notch 75 is located in a latch pocket 140 that protects the latch 70 during handling and impact.

FIG. 20 shows a perspective view of the top and bottom housings in an open exploded view for reference of the internal components. This view provides a view into the open cavity of the top housing 50 and the bottom housing 100 without obstruction of the semiconductor wafers.

Thus, specific embodiments of a semiconductor wafer container have been disclosed. It should be apparent, however, to those skilled in the art that many more modifications besides those described are possible without departing from the inventive concepts herein. The inventive subject matter, therefore, is not to be restricted except in the spirit of the appended claims.

What is claimed is:

1. A wafer container comprising:

a top housing and a bottom housing;

the top housing having a base with at least one rib that extends perpendicular from the base of the top housing in an essentially circular orientation;

the bottom housing having a base with at least one rib that extends perpendicular from the base of the bottom housing, wherein the at least one rib on the bottom housing is arranged concentric and at a different radius from the at least one rib that extends perpendicular from the base of the top housing, the at least one rib on the bottom housing having an arc angle of <360°;

the bottom housing having at least one latch that extends essentially perpendicular from the base of the bottom housing, wherein the distance between the base of the bottom housing to the top surface of the latch is less than the distance between the base of the bottom housing and the top of the at least one rib on the bottom housing;

the top housing having at least one latch well, the latch well having a bottom surface and a rim around the well, wherein the bottom surface is located below the surface of the base of the top housing, and wherein when the top housing is joined with the bottom housing, the top surface of the latch is lower than the rim around the well, and wherein the latch well comprises a notch configured to receive the at least one latch on the bottom housing.

2. The wafer container of claim 1, wherein the bottom surface of the latch well further comprises an angled or curved entry surface.

3. The wafer container of claim 1, wherein the top housing comprises four latch wells, one located in each corner of the top housing.

4. The wafer container of claim 1, wherein the bottom housing comprises four latches, one located in each corner of the bottom housing.

5. The wafer container of claim 1, wherein the notch of the latch well comprises two long sides and two short sides, and wherein one long side comprises an entry ramp and a recess, whereby the entry ramp and the recess provide further friction to the latch once the latch is engaged in the latch well.

6. A wafer container comprising:

a top housing and a bottom housing;

the top housing having a base with at least one rib that extends perpendicular from the base of the top housing in an essentially circular orientation;

the bottom housing having a base with a plurality of inner and outer arc sector ribs that extend perpendicular from the base of the bottom housing, wherein the inner and outer arc sectors ribs are arranged concentric with the at least one rib that extends perpendicular from the base of the top housing;

the bottom housing having at least one latch that extends essentially perpendicular from the base of the bottom housing, wherein the distance between the base of the bottom housing to the top surface of the latch is less than the distance between the base of the bottom housing and the top of the at least one rib on the bottom housing;

the top housing having at least one latch well, the latch well having a bottom surface and a rim around the well, wherein the bottom surface is located below the surface of the base of the top housing, and wherein when the top housing is joined with the bottom housing, the top surface of the latch is lower than the rim around the well, and wherein the latch well comprises a notch configured to receive the at least one latch on the bottom housing.

7. The wafer container of claim 6, wherein the top housing comprises four latch wells, one located in each corner of the top housing.

8. The wafer container of claim 6, wherein the bottom housing comprises four latches, one located in each corner of the bottom housing.

9. The wafer container of claim 6, wherein the notch of the latch well comprises two long sides and two short sides, and wherein one long side comprises an entry ramp and a recess, whereby the entry ramp and the recess provide further friction to the latch once the latch is engaged in the latch well.

* * * * *